United States Patent [19]

Yun

[11] Patent Number: 5,691,943
[45] Date of Patent: Nov. 25, 1997

[54] PAGE MODE MASK ROM USING A TWO-STAGE LATCH CIRCUIT AND A METHOD FOR CONTROLLING THE SAME

[75] Inventor: Chan Soo Yun, Kyoungkido, Rep. of Korea

[73] Assignee: Hyundai Electronics Industries Co., Ltd., Kyoungkido, Rep. of Korea

[21] Appl. No.: 659,837

[22] Filed: Jun. 7, 1996

[30] Foreign Application Priority Data

Jun. 7, 1995 [KR] Rep. of Korea .................. 1995-14967

[51] Int. Cl.⁶ .................................................. G11C 7/00
[52] U.S. Cl. .................................. 365/189.05; 365/233.5; 365/238.5
[58] Field of Search ........................... 365/189.05, 233, 365/233.5, 238.5

[56] References Cited

U.S. PATENT DOCUMENTS 5,295,117  3/1994  Okada ................................ 365/233.5
5,305,284  4/1994  Iwase ................................. 365/238.5

*Primary Examiner*—Joseph A. Popek
*Attorney, Agent, or Firm*—Jacobson, Price, Holman & Stern, PLLC

[57] ABSTRACT

The present invention discloses provides a page mode mask ROM capable of decreasing sense amplifiers by latching data using a two-stage latch circuit. Accordingly, the present invention provides a method for decreasing the number of amplifiers in memory device including an Y-predecoder, an Y-decoder, amplifiers and a cell array, said method comprising of the steps of: generating clock signals according to an address transition pulse; generating enable signal for driving said Y-predecoder and said amplifiers in response to said clock signals and said address transition pulse; amplifying data stored in said cell array in response to the output from said Y-decoder; latching the amplified data in a latch means; and transferring the latched data in said latch means to another latch means under the control of an address transition pulse generated whenever address transition occurs.

13 Claims, 8 Drawing Sheets

PAGE MODE MASK ROM USING A TWO-STAGE LATCH CIRCUIT AND A METHOD FOR CONTROLLING THE SAME

BACKGROUND OF THE INVENTION

1. Field of the Invention

The present invention relates to a page mode mask ROM using a two-stage latch circuit and a method for controlling the same, and more particularly, to a page mode mask ROM capable of random and page access.

2. Description of the Prior Art

Generally, a page mode mask ROM is in need of a random access and a page access. In a page mode mask ROM, a number of data are stored in a latch circuit so as to read the data at a high speed. For example, in case that 16-bit data (one word) are read out, the page mode mask ROM makes data which are not read through the latch circuit to be standby state and controls page mode addresses, and then can easily access the latched data in the latch circuit. This plays a role buffering the difference between the data processing speed in the external circuit and the data processing speed in the mask ROM, therefore, the speed of the system is improved.

In case that the conventional mask ROM has the page mode of ×16–8 words, 128 sense amplifiers (16 bit×9 word=128) are needed, and in case that the conventional mask ROM has the page mode of ×16–4 words, 64 sense amplifiers are need. It is in the natural order of events because the control method of the page mode mask ROM reads 128 bits and latches the data in the latch circuit.

However, in the conventional ROM technique, since total data are implemented as many as the sense amplifiers, the size of the chip is increased. Furthermore, since many amplifiers are simultaneously operate, the large power is temporally consumed.

SUMMARY OF THE INVENTION

It is therefore the object to provide a page mode mask ROM capable of decreasing sense amplifiers by latching data using a two-stage latch circuit.

It is another object to provide a method for controlling a page mode mask ROM with a smaller sense amplifiers.

In accordance with one aspect of the present invention, there is provided a memory device including a cell array storing data, comprising: an Y-predecoding means for decoding Y-addresses in response to an enable signal which is generated by a count circuit receiving clock signals, said count circuit being reset in response to an address transition pulse; an Y-decoding means for reading said data stored in said cell array according to the output from said Y-predecoding means; an amplification means for amplifying said data in response to said enable; at least one latch means including: a first latch means for storing said data from said amplification means; a second latch means for storing said data from said first latch means; and a switching means for transferring said data stored in said first latch means to said second latch means in response to a latch signal which is generated by said address transition pulse; and a control signal generating means for providing said enable with said Y-predecoding means and said amplification means and providing said latch signal with said latch means.

In accordance with another aspect of the present invention, there is provided a method for decreasing the number of amplifiers in memory device including an Y-predecoder, an Y-decoder, amplifiers and a cell array, said method comprising of the steps of: generating clock signals according to an address transition pulse; generating enable signal for driving said Y-predecoder and said amplifiers in response to said clock signals and said address transition pulse; amplifying data stored in said cell array in response to the output from said Y-decoder; latching the amplified data in a latch means; and transferring the latched data in said latch means to another latch means under the control of an address transition pulse generated whenever address transition occurs.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Hereinafter, a page mode mask ROM will be described in detail referring to the accompanying drawings.

In ×16–8 words page mode operation, data are composed of 128 bits. However, 128 bits are not simultaneously processed in a page mode mask ROM, and it is important to swiftly process the data by 16 bits. Accordingly, the present invention has 64 sense amplifiers which read the desired data during the first cycle, and then read another 64 bits during the second cycle. At this time, the data, which are already read out of memory cells, are stored in two-stage latch circuits, respectively.

This has the same effects as 128 sense amplifiers processing the data.

Figure 1:
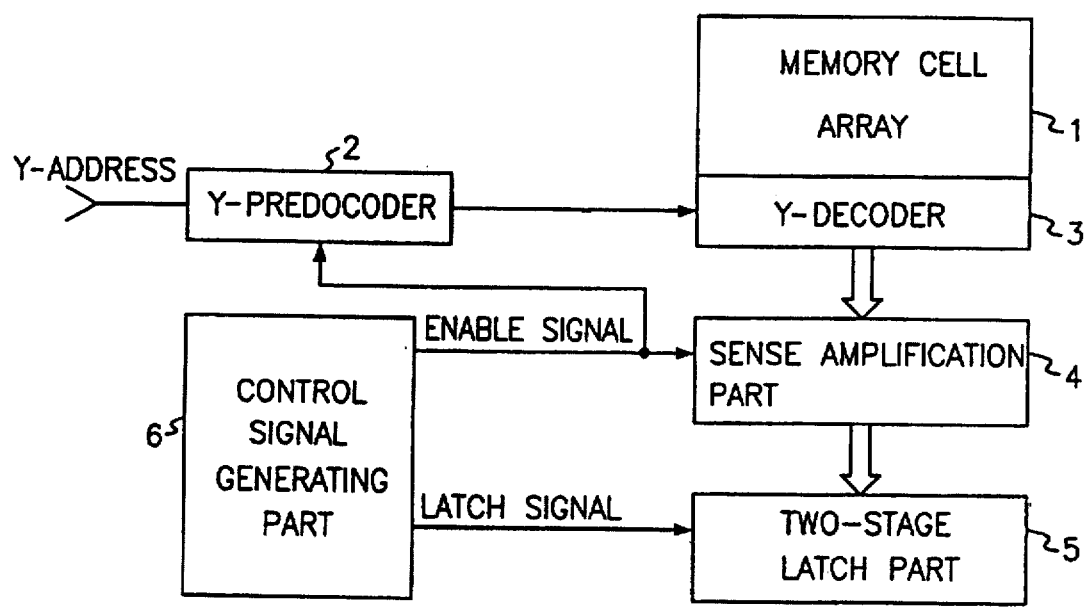
FIG. 1 is a block diagram illustrating a page mode mask ROM in accordance with the present invention.

FIG. 1 is a block diagram illustrating a page mode mask ROM in accordance with the present invention. In FIG. 1, the reference numerals 1, 2, 3, 4, 5 and 6 denote a memory cell array, an Y-predecoder, an Y-decoder, a sense amplification part, a two-stage latch part and a control signal generating part, respectively.

The Y-predecoder 2 decodes Y-addresses according to the enable signal from the control signal generating part 6, and the Y-decoder 3 reads data stored in the memory cell array according to the output of the Y-predecoder.

The sense amplification part 4, which is composed of sense amplifiers whose number is the same as that of the data bits read by the Y-decoder, senses and amplifies the data according to the enable signal from the control signal generating part 6. The two-stage latch part 5 latches the outputs of the sense amplification part 4 into the first and second stages therein, in order.

At the time of operating the entire page mode, the control signal generating part 6 allows the Y-predecoder 2, the Y-decoder 3 and the sense amplification part 4 to be operated twice, by generating an enable signal and a latch signal according to the MSB (Most Significant Bit) page address transition (A0 to A2). Also, the two-stage latch part 5 latches, in order, the data, which are read by the twice operation, into the first and second stages.

That is to say, the enable signal, which is generated just prior to the MSB page address transition, is input to the Y-predecoder 2 and the sense amplification part 4 under the control of the control signal generating part 6, whereby the Y-decoder 3 reads the data stored in the memory cell array. The data which are read through the Y-decoder 3 are amplified by the sense amplification part 4.

The control signal generating part 6 for ×16-8 words page mode operation will be describe below, referring to FIG. 2 and 3.

Figure 2:
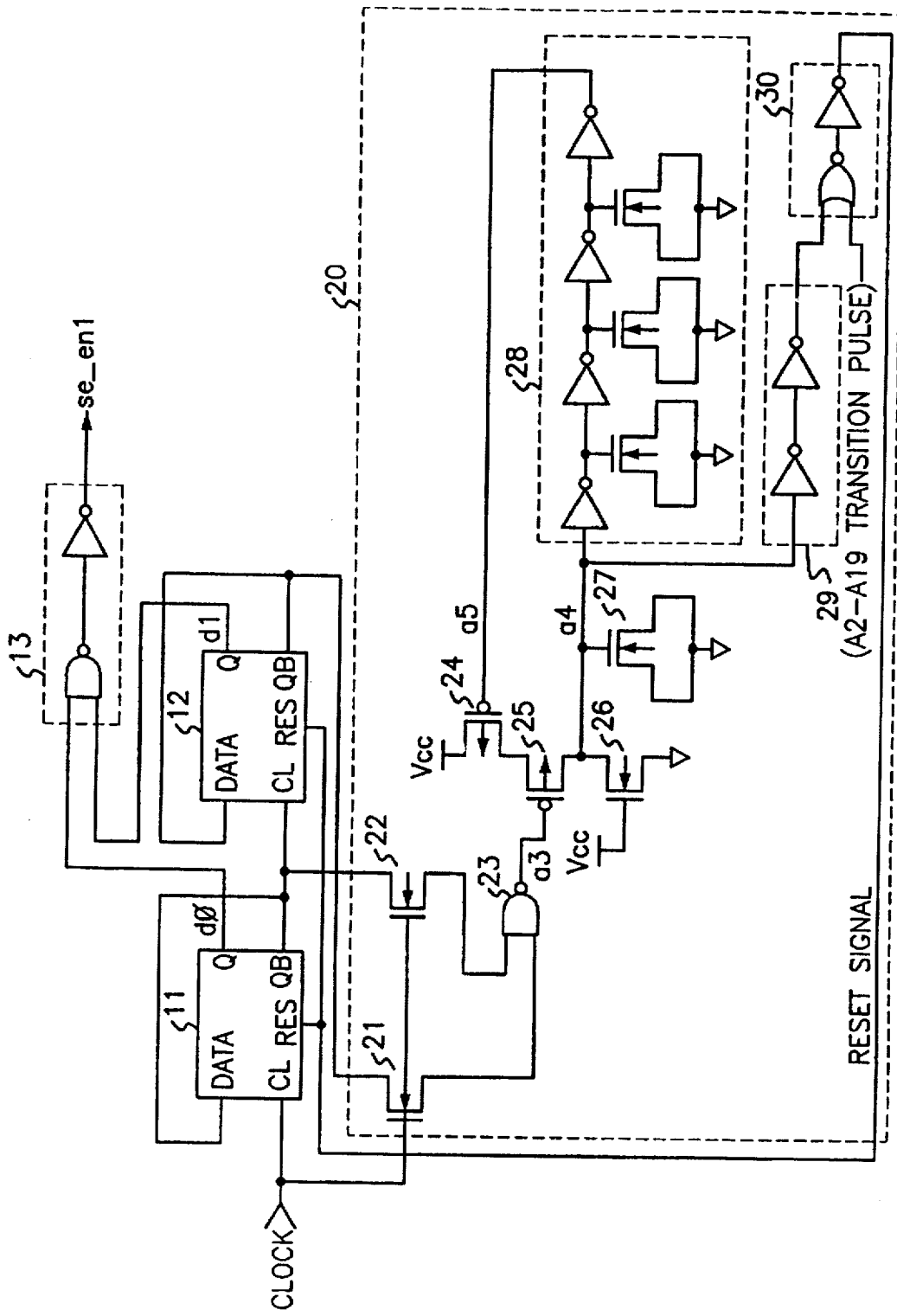
FIG. 2 is a block diagram illustrating the generation of an enable signal in FIG. 1.
Figure 3:
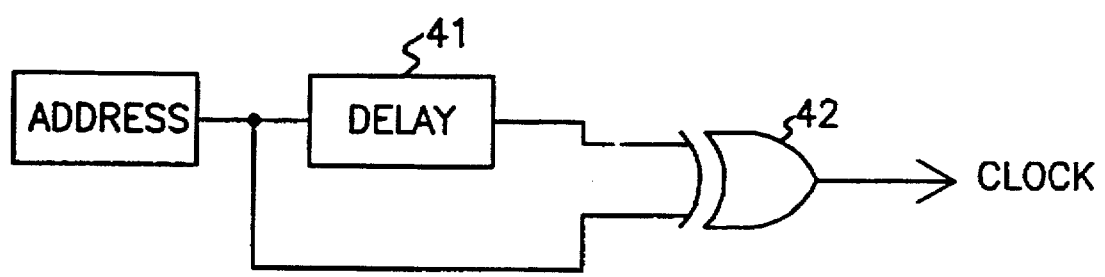
FIG. 3 is a block diagram illustrating a clock generating part in FIG. 1.

FIG. 2 is a block diagram illustrating the enable signal generation in the control signal generating part 6, and FIG. 3 is a block diagram illustrating the clock signal generating part to generate the clock signal used in enable signal generating part.

As shown in FIG. 2, the control signal generating part 6 is composed of D-flip flops 11 and 12, an AND gate 13 and a reset signal generating part 20. Furthermore, as shown in FIG. 3, the clock generating part is constituted to generate the clock signal whenever the LSB (least significant bit) page addresses (A0 and A1) transition occurs. That is, the clock generating part is composed of a delay part 41 to delay the LSB page address for a predetermined time and an exclusive-OR gate 42 to receive the output of the delay part 41 and the address.

Referring again to FIG. 2, the clock from the clock generation part is input to the clock terminal (CL) of the D-flip flop 11 and the D-flip flop 11 receives the output from its inverted output terminal through the input terminal thereof, by forming the feed back loop. A D-flip flop 12 receives the inverted output of the D-flip flop 11, and, in the same manner, the D-flip flops 12 receives the output from its inverted output terminal through the input terminal thereof, by forming the feed back loop.

An AND gate 13, which consists of an NAND gate and an inverter, receives the outputs of the D-flip flops 11 and 12 and outputs the enable signal (se_en1).

Figure 4A:
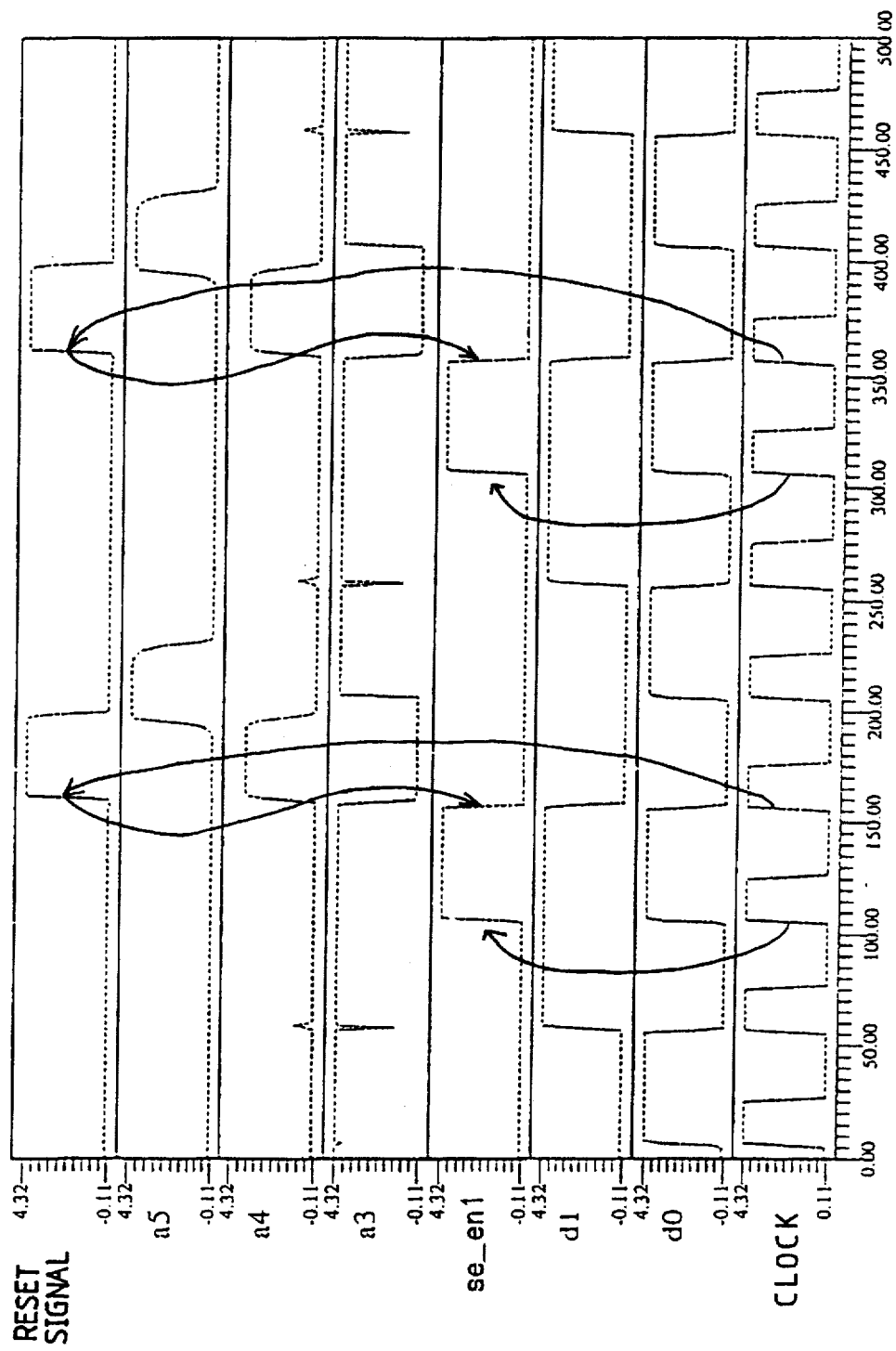
FIGS. 4A and 4B are timing diagrams illustrating internal signals in FIG. 2.

On the other hand, the reset signal generating part 20 is constituted to reset the D-flip flops 11 and 12 when the fourth (or eighth) clock is input FIG. 4A. Accordingly, the enable signal (se_en1) is output if the third clock signal is input, and if the fourth clock signal is input the result signal is output and the enable signal has a low level.

The reset signal generating part 20 outputs the reset signal for resetting the D-flip flops 11 and 12 using an address transition pulse, the clock signal which is input to the D-flip flops 11 and 12 and the inverted outputs from the D-flip flops 11 and 12.

First, the clock signal is respectively applied to the gates of the transistors 21 and 22 and the two inverted outputs from the D-flip flops 11 and 12 are input to a NAND gate 23 through the transistors 21 and 22. The output from the NAND gate 23 is applied to PMOS transistor 25 through node a3, the source of which is coupled to PMOS transistor 24 and the drain of which is coupled to NMOS transistor 26. Also, the connection point between the PMOS transistor 25 and the NMOS transistor 26 is coupled to capacitive transistor 27 at node a4. The gate of the capacitive transistor 27 is coupled to the first delay part 28 which is connected to the gate of the PMO transistor 24 of which the source is coupled to the driving voltage (Vcc).

Because the gate of the NMOS transistor 26 is coupled to the driving voltage (Vcc) and the drain thereof is coupled to the capacitive transistor 27, the voltage levels at node a3 and a4 are out of phase as shown in FIG. 4A. Also, the second delay part 29, which is composed of two inverters, is couple to the gate of capacitive transistor 27. The output from the second delay part 29 is added to the address transition pulse in addresses (A2 to A19) from a address transition pulse generator (not shown) through a OR gate 30 which consists of a NOR gate and an inverter. Finally, the output from the OR gate 30 is input to the reset terminals of the D-flip flops 11 and 12.

Figure 4B:
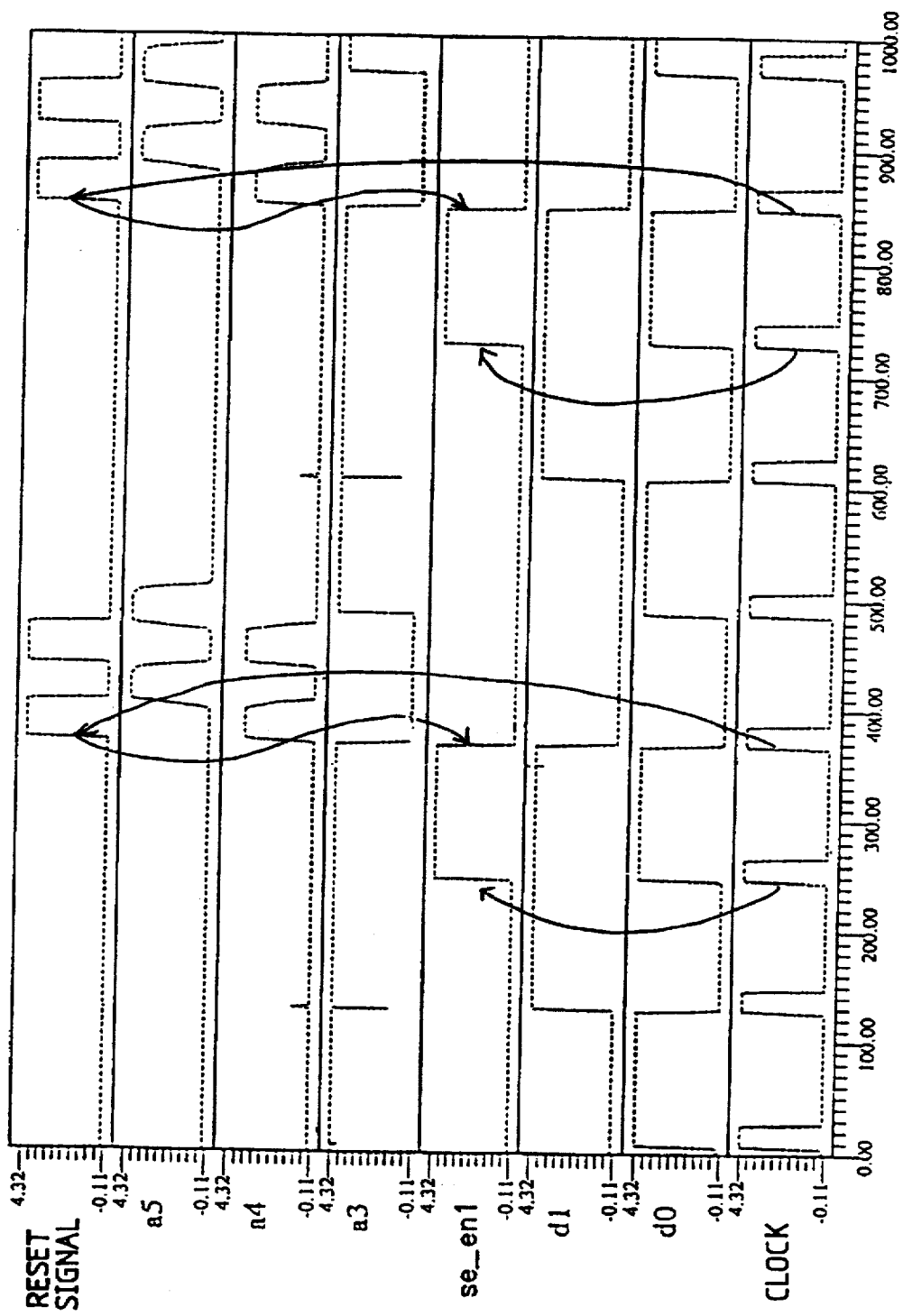

FIGS. 4A and 4B are timing diagrams showing the wave forms of the internal signals in FIG. 2 in 50 nsec and 120 nsec, respectively. As shown in FIGS. 4A and 4B, the transition of the enable signal (se_en1) occurs from low level to high level when the potential of the third (or seventh) clock is transited from low level to high level, and occurs from high level to low level when the potential of the fourth (or eighth) clock is transferred from low level to high level.

Referring again to FIG. 1, when this enable signal in FIG. 2 is generated, the Y-predecoder 2 and the 64 sense amplifiers in the sense amplification part 4 are driven.

Figure 5A:
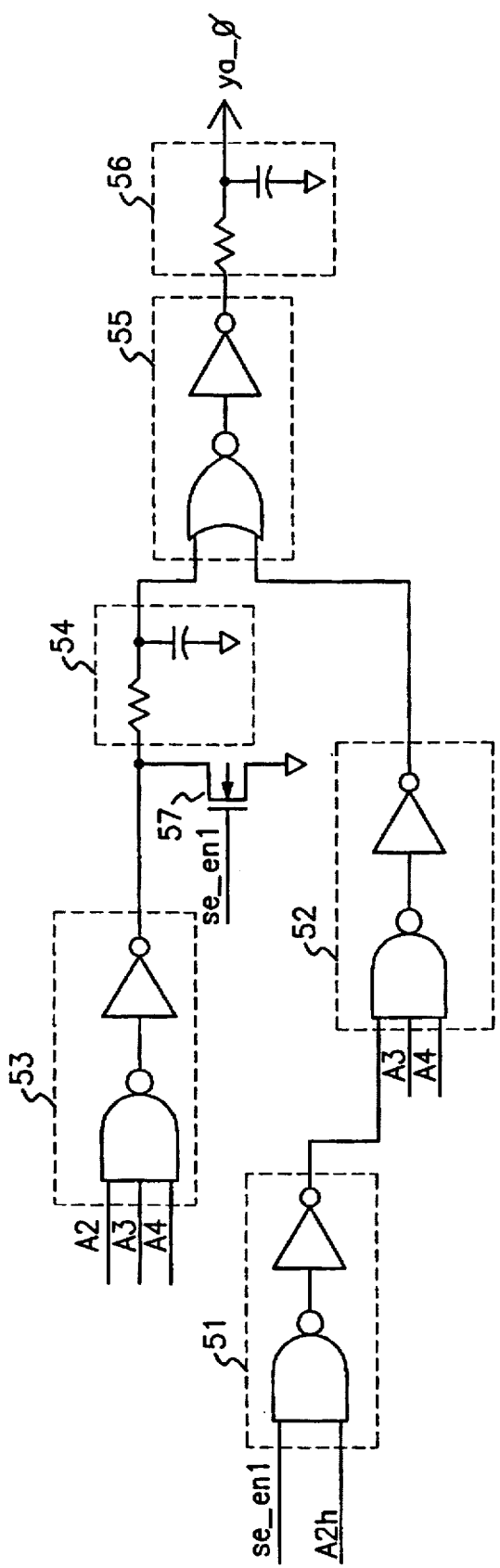
FIGS. 5A and 5B are block diagrams illustrating the Y-precoder in FIG. 1.
Figure 5B:
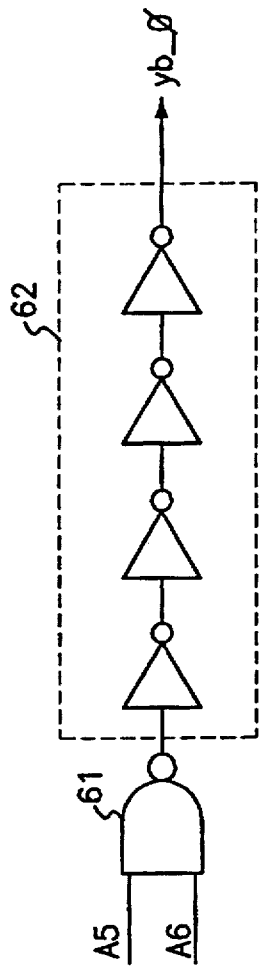

FIGS. 5A and 5B are block diagrams illustrating the Y-predecoder in FIG. 1, respectively, in which the Y-predecoder consists of ya and yb-predecoders.

As shown in FIG. 5A, an AND gate 51 receives the inverted value of the MSB page address A2 and the enable signal (sn_en1) an AND gate 52 receives the output from the AND gate 51 and addresses A3 and A4. An AND gate 53 receives address A2, A3 and A4 and the AND gate 53 is coupled to the low pass filter 54 and the transistor 57. At this time, the gate of the transistor 57 receives the enable signal and the source thereof is coupled to the ground. The outputs from the AND gate 52 and the filter 54 are added up through an OR gate 55 and the logic summation is output to the Y-decoder through the low pass filter 56.

The yb-predecoder consists of the NAND gate 61 receiving address A5 and A6 and a delay part 62 as shown FIG. 5B.

Figure 7:
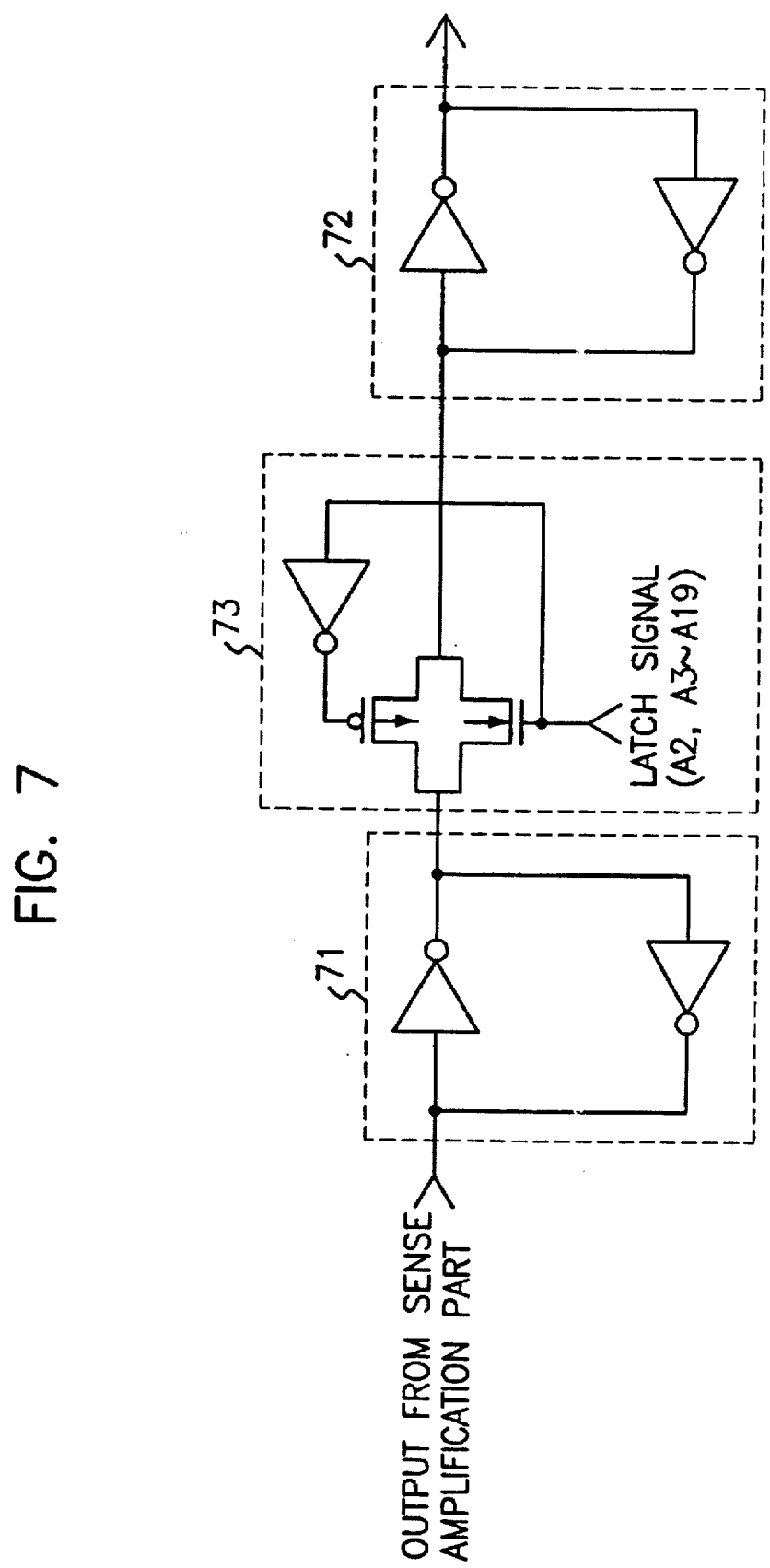
FIG. 7 is a block diagram illustrating two-stage latch part in FIG. 1.

FIG. 7 is a block diagram illustrating the two-stage latch part in FIG. 1. As shown in FIG. 7, the two-stage latch part 5 consists of the first and second latch circuits 71 and 72 and a switching part 73 which is controlled by the latch signal from the control signal generating part 6 (strictly, the address transition pulse generator). In FIG. 7, whenever the transition of the MSB page address (A2) and normal addresses (A3 to A19) is generated, the switching part 73 connects the first latch circuit 71 to the latch circuit 72, by receiving the latch signal from the address transition pulse generator in the control signal generating part 6 of FIG. 2. Accordingly, when the address transition occurs, the switching part 73 transfers the data latched in the first latch circuit 71 to the second latch circuit 72.

Referring again to FIG. 3, the clock signal is generated whenever the page address (A0 and A1) transition occurs. This clock signal is input to the control signal generating part 6 so that the enable signal is generated if there is an address transition in addresses (A2 to A19). It is to be noted that the enable signal, which is input to the Y-predecoder 3 and the sense amplification part 4 before the switching part 73, connects the first latch circuit 71 to the latch circuit under the control of the latch signal from the address transition pulse generator in the reset signal generating part 20. That is the enable signal goes ahead of the latch signal by one clock period.

Figure 6:
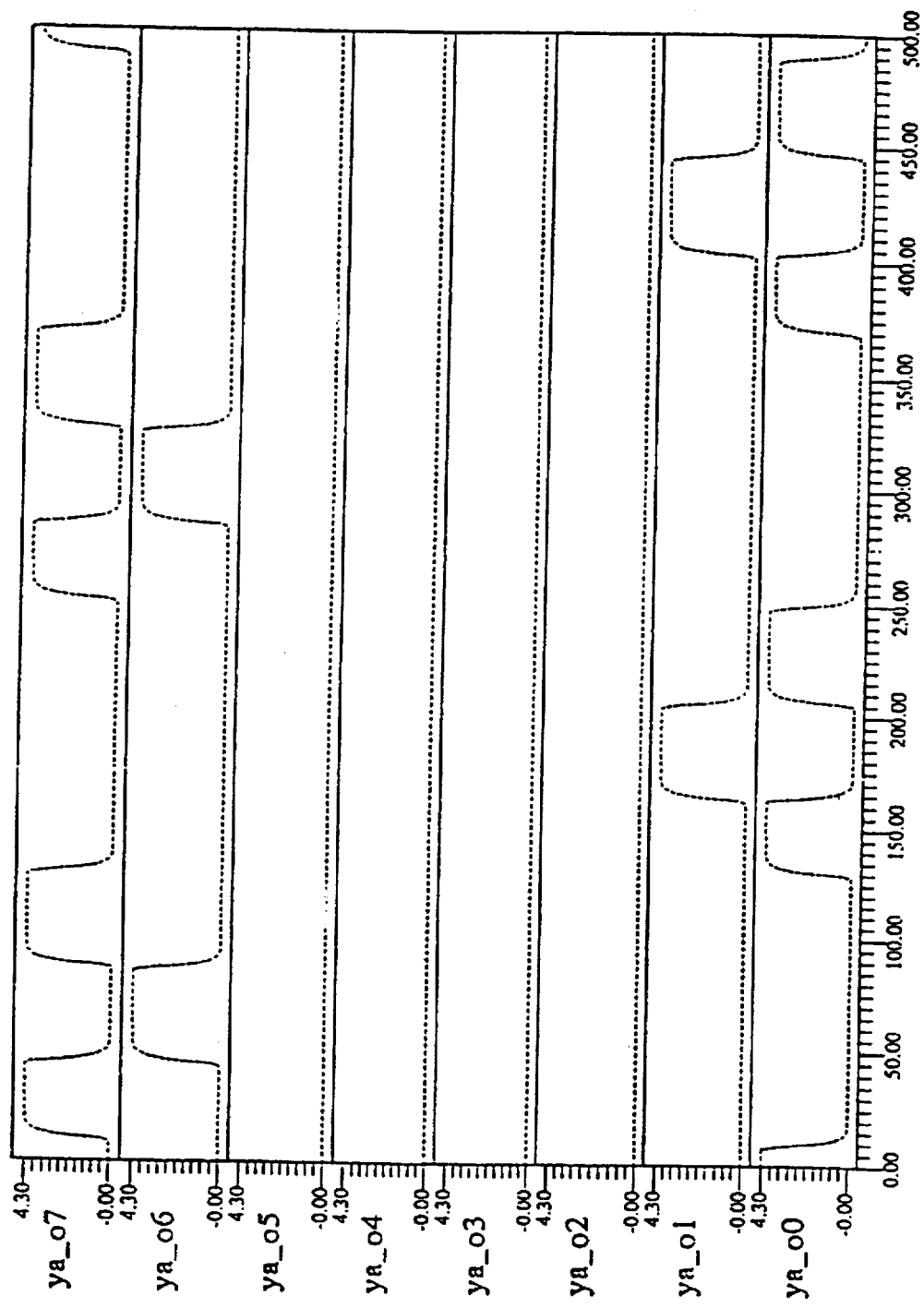
FIG. 6 is a timing diagram illustrating the output signals from the Y-predecoder FIG. 5A.

FIG. 6 is a timing diagram illustrating output the signals from the Y-predecoder. As shown in FIG. 6, if the output ya_07 from the FIG. 5A has a high level, 64 amplifiers operate and the amplified data are latched in the first latch circuit 71 of the two-stage latch part 5. If there is an address (A2 to A19) transition, the latched data in the first latch circuit 71 are transferred to the second latch circuit 72. At the time of the page access operation, if the enable signal is generated and the output ya_06 has a high level, the 64 amplifiers operate and other data are latched in the first latch circuit 71.

As apparent from above description, the present invention has effects capable of decreasing the chip size and power, by decreasing amplifiers using two-stage latch circuits.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A memory device including a cell array storing data comprising:

an Y-predecoding means for decoding Y-addresses in response to an enable signal which is generated by a count circuit receiving clock signals, said count circuit being reset in response to an address transition pulse;

an Y-decoding means for reading said data stored in said cell array according to the output from said Y-predecoding means;

an amplification means for amplifying said data in response to said enable signal; and a control signal generating means for providing said enable signal with said Y-predecoding means and said amplification means and generating a latch signal;

at least one latch means including:
   a first latch means for storing said data from said amplification means;
   a second latch means for storing said data from said first latch means; and
   a switching means for transferring said data stored in said first latch means to said second latch means in response to said latch signal which is generated by said control signal generating means.

2. The memory device in accordance with claim 1, wherein said latch signal is delayed by one clock period after said enable signal.

3. The memory device in accordance with claim 1, wherein said memory device operates in a page access mode.

4. The memory device in accordance with claim 3, wherein said latch signal is generated when the transition of the most significant bits of page addresses occurs.

5. The memory device in accordance with claim 3, wherein said latch signal is generated when the transition of the most significant bits of normal addresses occurs.

6. The memory device in accordance with claim 3, wherein said Y-predecoding means comprises:

a first ANDing means for receiving said enable signal and the inverted output of a most significant bit page address;

a second ANDing means for receiving the output of said first ANDing means and Y-addresses;

a third ANDing means for receiving the most significant bit page address and said Y-addresses;

a pass transistor for grounding the voltage level of the output terminal of said third ANDing means in response to said enable signal;

a low pass filtering means for filtering the output of said third ANDing means; and a ORing means for receiving the outputs of said second ANDing means and said low pass filtering means.

7. The memory device in accordance with claim 1, wherein said count circuit comprises:

D-flip flops for receiving said clock signals and outputting said enable signal;

a reset signal generating means for resetting said D-flip flops in response to said address transition pulse.

8. The memory device in accordance with claim 7, wherein said count circuit further comprises a clock signal generating means for generating said clock signals when the transition of page addresses occurs.

9. The memory device in accordance with claim 7, wherein said reset signal generating means comprises:

a NANDing means for receiving the outputs from said D-flip flops according to said clock signals;

a first PMOS transistor having a gate which is coupled to the output terminal of said NANDing means;

a NMOS transistor having a gate which is coupled to a driving voltage terminal, a source which is coupled to a ground and a drain which is coupled to the drain of said first PMOS transistor;

a second PMOS transistor having a source which is coupled to said driving voltage terminal and a drain which is coupled to the source of said first PMOS transistor;

a capacitor connected to the drain of said first PMOS transistor;

a first delay means connected between the gate of said second PMOS transistor and said capacitor;

a second delay means connected to said capacitor; and a ORing means for receiving the outputs from said second delay means and said address transition pulse and outputting said reset signal to said D-flip flops.

10. The memory device in accordance with claim 8, wherein said clock generating means comprises:

a delay means for delaying the least significant bit addresses; and a exclusive-ORing means for receiving the output of said delay means and said addresses.

11. A method for decreasing the number of amplifiers in memory device including an Y-predecoder, an Y-decoder, amplifiers and a cell array, said method comprising of the steps of:

generating clock signals according to an address transition pulse;

generating an enable signal for driving said Y-predecoder and said amplifiers in response to said clock signals and said address transition pulse;

amplifying data stored in said cell array in response to the output from said Y-decoder;

latching the amplified data in a latch means; and transferring the latched data in said latch means to another latch means in response to the address transition pulse generated whenever address transition occurs.

12. The method in accordance with claim 11, wherein said memory device operates in a page access mode.

13. The method in accordance with claim 12, wherein said clock signals are generated whenever the transition of page addresses occurs, irrespective of the most significant bits of the page addresses.

* * * * *